United States Patent
Sauer

(10) Patent No.: US 10,521,332 B1
(45) Date of Patent: Dec. 31, 2019

(54) PARAMETRIZATION OF A SIMULATION MODEL

(71) Applicant: dSPACE digital signal processing and control engineering GmbH, Paderborn (DE)

(72) Inventor: Joerg Sauer, Detmold (DE)

(73) Assignee: DSPACE DIGITAL SIGNAL PROCESSING AND CONTROL ENGINEERING GMBH, Paderborn (DE)

( * ) Notice: Subject to any disclaimer, the term of this patent is extended or adjusted under 35 U.S.C. 154(b) by 0 days.

(21) Appl. No.: 16/145,208

(22) Filed: Sep. 28, 2018

(51) Int. Cl.
  *G06F 9/44* (2018.01)
  *G06F 11/36* (2006.01)
  *G06F 17/50* (2006.01)
  *G06F 8/34* (2018.01)

(52) U.S. Cl.
  CPC ............ *G06F 11/3664* (2013.01); *G06F 8/34* (2013.01); *G06F 11/3688* (2013.01); *G06F 17/5009* (2013.01)

(58) Field of Classification Search
  None
  See application file for complete search history.

(56) References Cited

U.S. PATENT DOCUMENTS

| | | | | |
|---|---|---|---|---|
| 6,078,739 A * | 6/2000 | Paterson | ................. | G06Q 10/04 703/6 |
| 2003/0107595 A1 * | 6/2003 | Ciolfi | ........................ | G06F 8/34 715/762 |
| 2008/0022270 A1 * | 1/2008 | Morrow | ..................... | G06F 8/38 717/155 |
| 2009/0125129 A1 * | 5/2009 | Eldridge | ................ | G05B 15/02 700/86 |
| 2009/0249281 A1 * | 10/2009 | Fritzsche | ............ | G06F 11/3447 717/104 |
| 2010/0088664 A1 * | 4/2010 | Khodabandehloo | ...... | G06F 8/20 717/103 |
| 2012/0030631 A1 * | 2/2012 | Gonzalez | .............. | G06F 3/0482 715/854 |

(Continued)

OTHER PUBLICATIONS

Nimble user manual, version 0.8.0, 13.1.1 Determining the nodes in a model—r-nimble, cached 2010 (Year: 2010).*
Matlab / Simulink, TwinCAT 3 Jul. 6, 2017 (Year: 2017).*

*Primary Examiner* — Insun Kang
(74) *Attorney, Agent, or Firm* — Leydig, Voit & Mayer, Ltd.

(57) ABSTRACT

A method for parametrization of a simulation model includes: composing the simulation model based on placement of elementary blocks and line connectors between the elementary blocks; adding a first marker block containing a first digital identifier to a first subsystem in the simulation model; adding a second marker block containing a second digital identifier to a second subsystem in the simulation model; analyzing the simulation model; listing parameters of the simulation model in a hierarchical tree and displaying the hierarchical tree on a screen to facilitate altering the parameters of the simulation model via the hierarchical tree; and determining whether to list the first subsystem and the second subsystem in a common node of the hierarchical tree or in separate nodes of the hierarchical tree based on whether or not the first digital identifier and the second digital identifier are identical.

7 Claims, 4 Drawing Sheets

(56) References Cited

U.S. PATENT DOCUMENTS

| | | | |
|---|---|---|---|
| 2012/0123764 A1* | 5/2012 | Ito | G06F 9/5055 |
| | | | 703/21 |
| 2017/0286190 A1* | 10/2017 | Ishakian | G06Q 10/0633 |
| 2018/0032362 A1* | 2/2018 | Buil | G06F 9/4856 |
| 2018/0260739 A1* | 9/2018 | Shao | G06F 15/16 |
| 2018/0336018 A1* | 11/2018 | Lu | G06F 8/36 |
| 2019/0020552 A1* | 1/2019 | Poort | H04L 41/147 |

* cited by examiner

PARAMETRIZATION OF A SIMULATION MODEL

FIELD

The invention concerns graphical programming and virtual testing.

BACKGROUND

Virtual testing refers to the testing of control software in a virtual environment. Control software is software meant to be disposed in an embedded computer system in order to control an automated technical process. Especially in the case of safety critical control software it is common to test and validate the control software in a virtual environment before testing in the field. A simulation model is created to simulate the environment in which the control software is destined to work, including sensors on whose sensor data the control software relies, and actuators which the control software is configured to control. The simulation model is set up to feed simulated sensor data into the control software, to read actuator data from the control software, and to account for the actuator data in each time step of the simulation.

Simulation models for control software are commonly created in graphical programming environments, such as Simulink by MathWorks or LabVIEW by National Instruments. Also, various parametrization software tools exist to help a user keep track of the numerous parameters in a large simulation model corresponding to a graphical program. Examples include ModelDesk by dSPACE, CarMaker by IPG Automotive, or DYNA4 by TESIS. These tools are programmed to analyze a simulation model and display the alterable parameters scattered over the simulation model in a hierarchical tree structure, making it easier to find a certain parameter and alter it via the tree structure.

The composition of nodes in the hierarchical tree is usually determined by predefined rules or specifications programmed into the parametrization software. In recent times, however, simulation models in some fields, especially in the field of automotive control systems, have grown ever more complex, making it increasingly difficult to define a strict set of rules that will always generate a clear and meaningful composition of nodes. There is need for a convenient method to customize the structure of the hierarchical tree of parameters in a parametrization software.

A graphical programming environment may be software that provides access to a block library, the block library containing a number of elementary blocks, at least some of the elementary blocks being set up to perform a basic data operation. The graphical programming environment may be set up to receive user input to place a number of elementary blocks extracted from the block library, connect the extracted blocks via line connectors, wherein a line connector between two blocks indicates data flow between said blocks, such that the extracted blocks and the line connectors as a whole constitute a simulation model. The graphical programming environment may also be set up to receive user input to organize the elementary blocks in the simulation model in subsystems, wherein each subsystem may contain a number of elementary blocks and/or further subsystems. The graphical programming environment may also be set up to run the simulation model on the fly or to translate the simulation model's program logic into a programming language or a machine language, thus making the simulation model runnable on a processing unit independently from the graphical programming environment.

SUMMARY

In an exemplary embodiment, the invention provides a method for parametrization of a simulation model. The method includes: composing, by a graphical programming environment of a simulation system, the simulation model based on placement of elementary blocks and line connectors between the elementary blocks, wherein the elementary blocks correspond to data operations and the line connectors correspond to data flows, and wherein the elementary blocks are organizable into subsystems, each subsystem comprising one or more elementary blocks and/or one or more further subsystems; adding, by the graphical programming environment, a first marker block containing a first digital identifier to a first subsystem in the simulation model; adding, by the graphical programming environment, a second marker block containing a second digital identifier to a second subsystem in the simulation model; analyzing, by parametrization software of the simulation system, the simulation model, wherein the parametrization software is configured to recognize marker blocks in the simulation model; listing, by the parametrization software, parameters of the simulation model in a hierarchical tree and displaying the hierarchical tree on a screen to facilitate altering the parameters of the simulation model via the hierarchical tree; and determining, by the parametrization software, whether to list the first subsystem and the second subsystem in a common node of the hierarchical tree or in separate nodes of the hierarchical tree based on whether or not the first digital identifier and the second digital identifier are identical, and listing the first subsystem and the second subsystem in a common node of the hierarchical tree or in separate nodes of the hierarchical tree based on a result of the determining.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
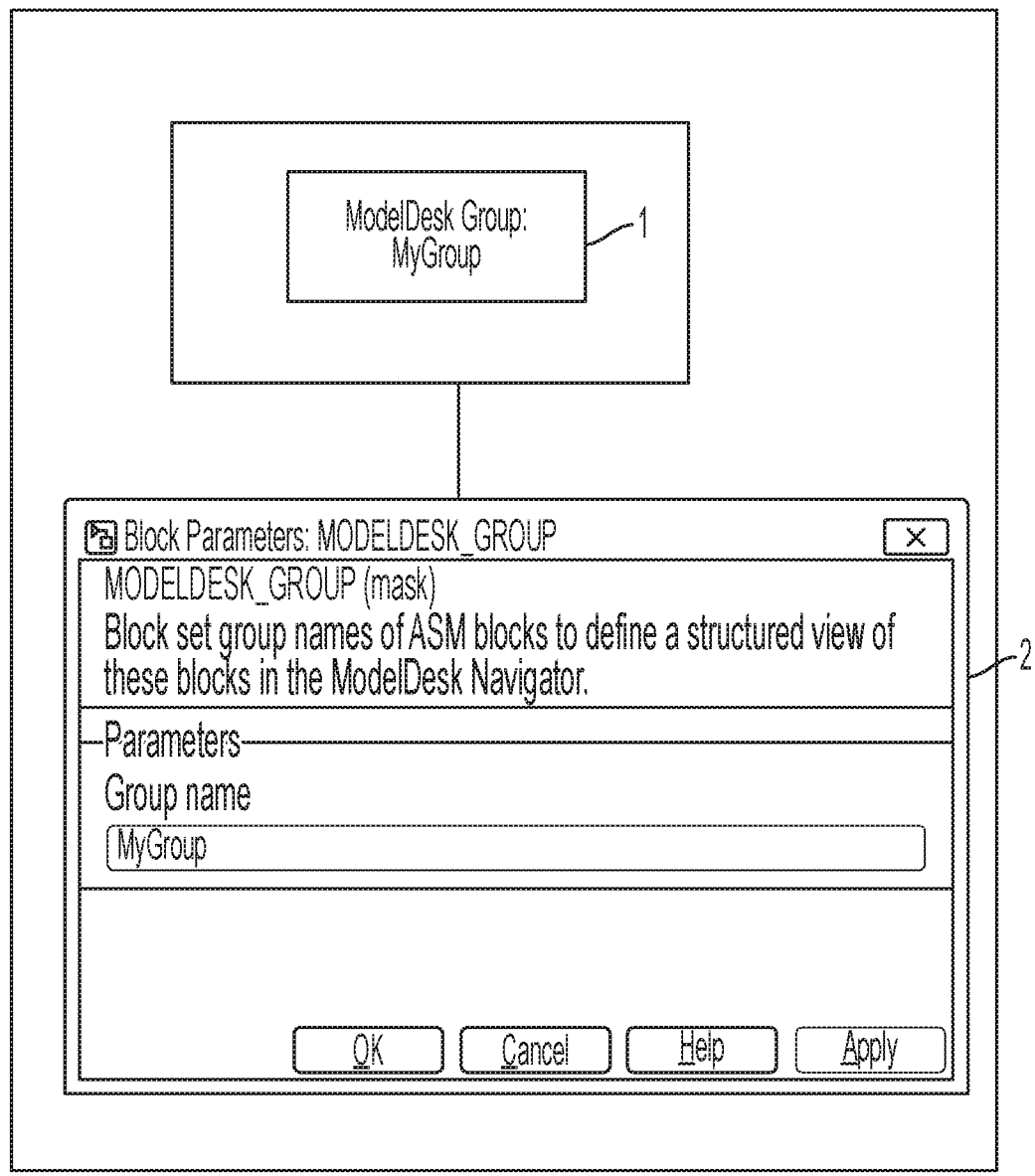
FIG. 1 depicts an exemplary marker block.

In one exemplary embodiment of the invention, a marker block is present in the library of elementary blocks. The marker block is ready to be placed in a simulation model by a user, wherein the marker block remains present in the library after having been placed in a simulation model. In other words, the process of placing the marker block in a simulation model is a process of copying the marker block. Said process of copying may be repeated at will, such that a marker block may be placed at multiple locations in the simulation model.

The library of elementary blocks may comprise a standard block library providing a number of standard elementary blocks, and an expansion block library providing a number of non-standard elementary blocks, the marker block being part of the expansion block library.

In one exemplary embodiment, the marker block in the library of elementary blocks is set up to receive user input to deposit a digital identifier in the marker block. In another exemplary embodiment, each marker block in the simulation model is set up to receive user input to deposit a digital identifier in the marker block. Parametrization software may be set up to analyze the simulation model and, in the course of analyzing the simulation model, to recognize marker blocks in the simulation model and to identify the digital identifier in each marker block. The parametrization software may also be set up to list parameters present in the simulation model in a hierarchical tree and display the hierarchical tree on a screen, to receive user input to access a parameter in the hierarchical tree and alter the value of the accessed parameter according to the user input, and to alter the value of said parameter in the simulation model according to the user input.

When a first marker block with a first digital identifier is placed in a first subsystem of the simulation model, and a second marker block with a second digital identifier is placed in a second subsystem of the simulation model, the parametrization software is configured to list the first subsystem and the second subsystem in a common node of the hierarchical tree if the first digital identifier and the second digital identifier are identical. On the other hand, if the first digital identifier and the second digital identifier are not identical, the parametrization software will list the first subsystem and the second subsystem in separate nodes of the hierarchical tree.

In other words, the marker blocks provide a possibility to override the internal rules of the parametrization software on how to arrange the hierarchical tree. Assume, for example, a simulation model for a truck with two trailers that contains a parametrizable model component for each wheel. The parametrization software may be programmed to list similar model components, like trailer wheels, in common nodes, so the parametrization software may list the parameters for all the trailer wheels of both the first and the second trailer in one single node of the hierarchical tree. The user may then, before utilizing the parametrization software, place a first marker block in a first subsystem that contains the model component that simulates the first trailer, and a second marker block with a different digital identifier in a second subsystem that simulates the second trailer. The parametrization software will recognize the marker blocks and, due to their digital identifiers being different, recognize the first trailer and the second trailer as separate entities that are each to be given their own node in the hierarchical tree.

On the other hand, a user may utilize the marker blocks to combine simulation model components in the hierarchical tree that by default would be listed separately. For example, an automotive developer may be testing a control software for which a vehicle's undercarriage is relevant, but also the clutch and the gearbox. The developer may then place a marker block in the subsystems containing the model components for the undercarriage, the clutch, and the gearbox, respectively, and deposit identical digital identifiers in all three marker blocks. The parametrization software will find the marker blocks, notice the identity of their digital identifiers, and will provide a node in the hierarchical tree that contains the parameters for the undercarriage, the clutch, and the gearbox.

A software environment may comprise a component library, the component library comprising a number of simulation model components, wherein each simulation model component may be composed of elementary blocks and line connectors. A simulation model may be composed by extracting a number of simulation model components from the component library and connecting the extracted simulation model components via line connectors, thus setting the extracted simulation model components up for data exchange between the extracted simulation model components.

The parametrization software may be configured to recognize simulation model components in a simulation model in the course of analyzing the simulation model. The parametrization software may be configured to create one node in the hierarchical tree for each simulation model component, said node representing said simulation model component, and to list parameters from each simulation model component in the node representing said simulation model component.

Each simulation model component may comprise a digital component identifier that may be deposited outside of any marker block, wherein a component identifier may already be present in the component library and may be carried over from the component library to a simulation model. A number of digital component identifiers may be stored and predefined in the parametrization software. The parametrization software may be configured to recognize digital component identifiers in the simulation model and use the digital component identifiers to identify simulation model components that originate from the component library. The parametrization software may be configured to create one node in the hierarchical tree for each unique digital component identifier in the simulation model.

If the first digital identifier and the second digital identifier are identical, the parametrization software may be configured to list the first subsystem and the second subsystem at a hierarchical position where either the first subsystem or the second subsystem would be listed if no marker blocks where present in the simulation model, depending on which of the first subsystem or the second subsystem would be listed higher.

Further scope of applicability of the present invention will become apparent from the detailed description given hereinafter. However, it should be understood that the detailed description and specific examples, while indicating preferred embodiments of the invention, are given by way of illustration only, since various changes, combinations and modifications within the spirit and scope of the invention will become apparent to those skilled in the art from this detailed description.

Figure 2:
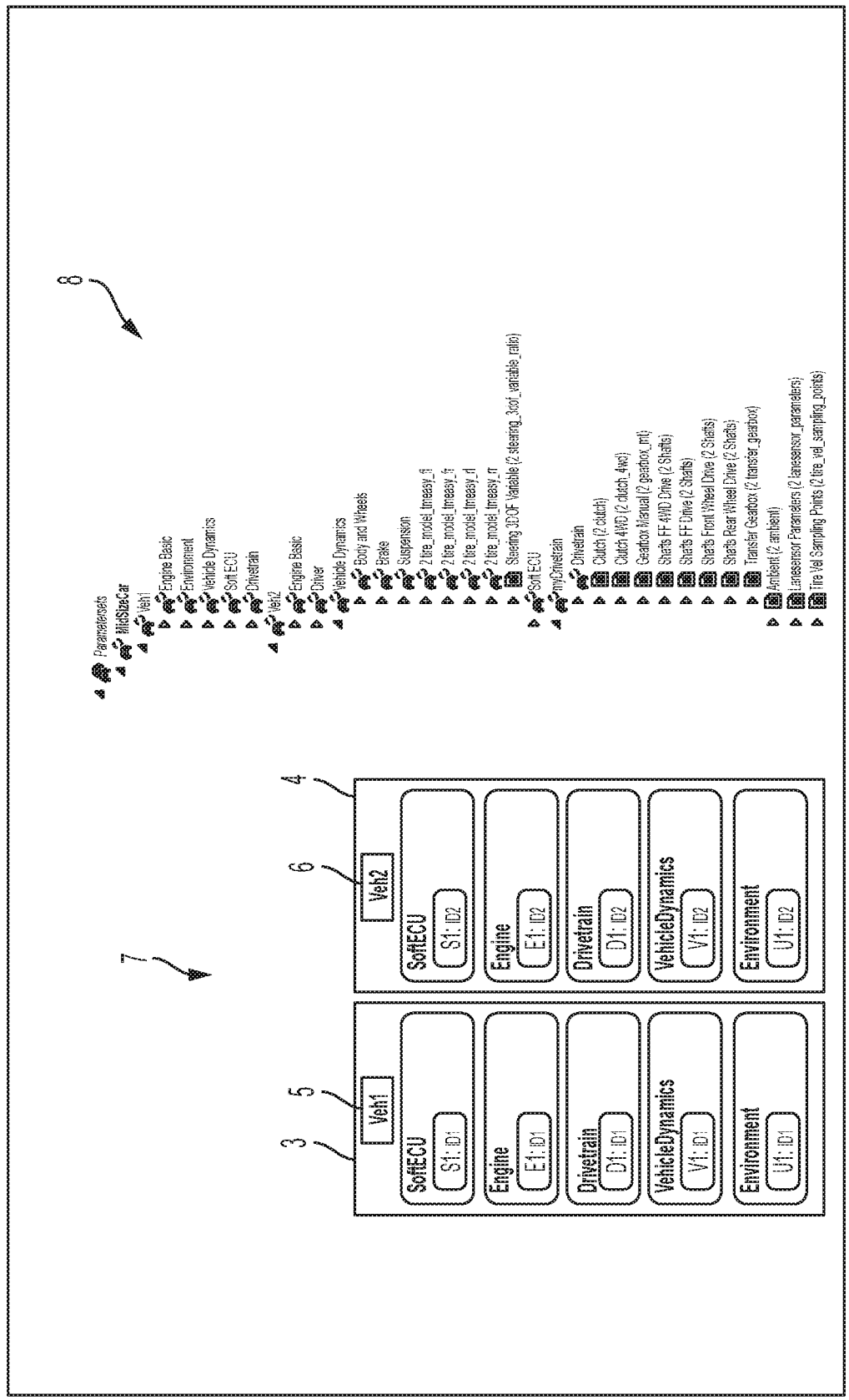
FIGS. 2-4 depict different exemplary applications of marker blocks.
Figure 3:
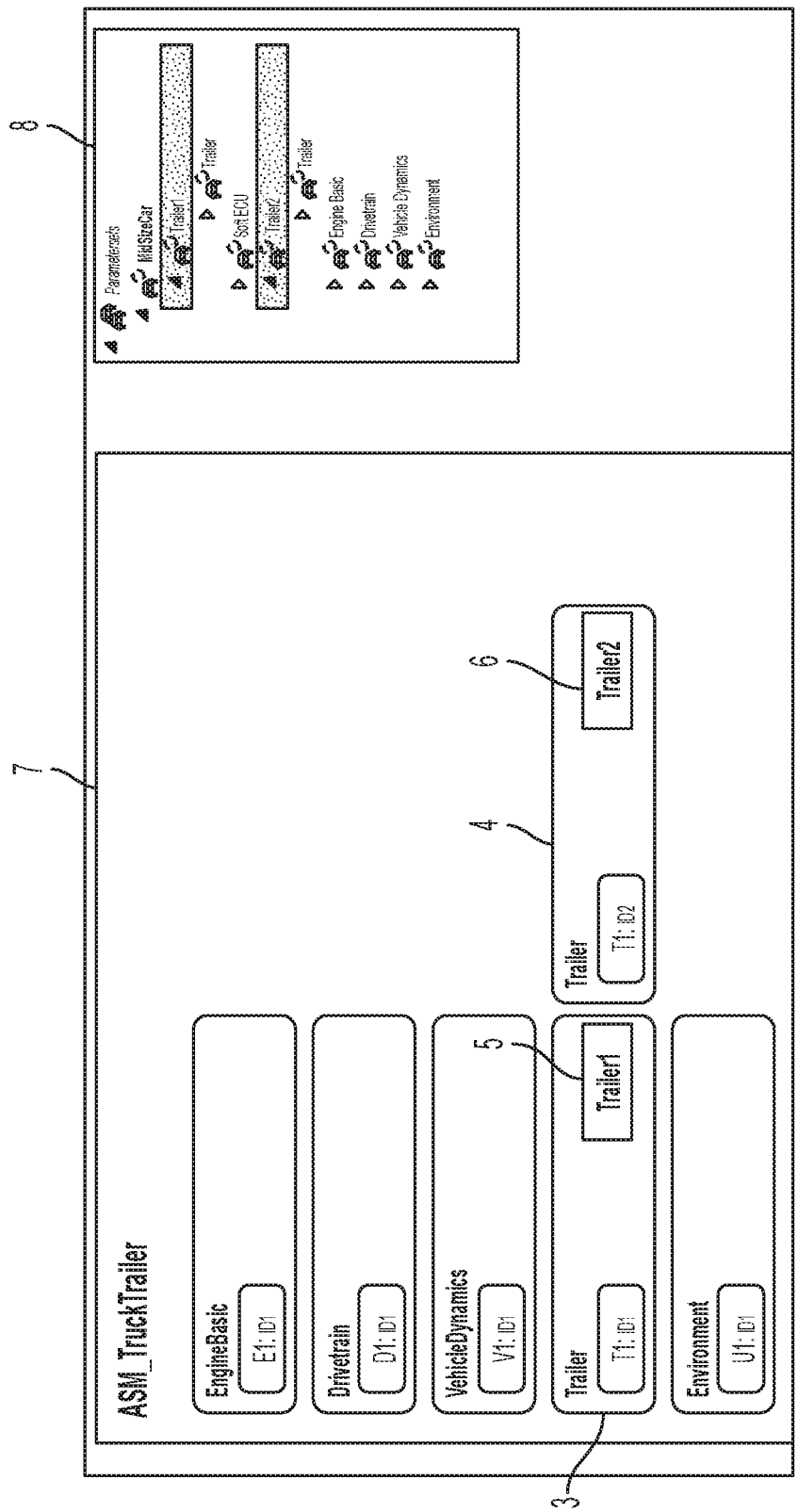
Figure 4:
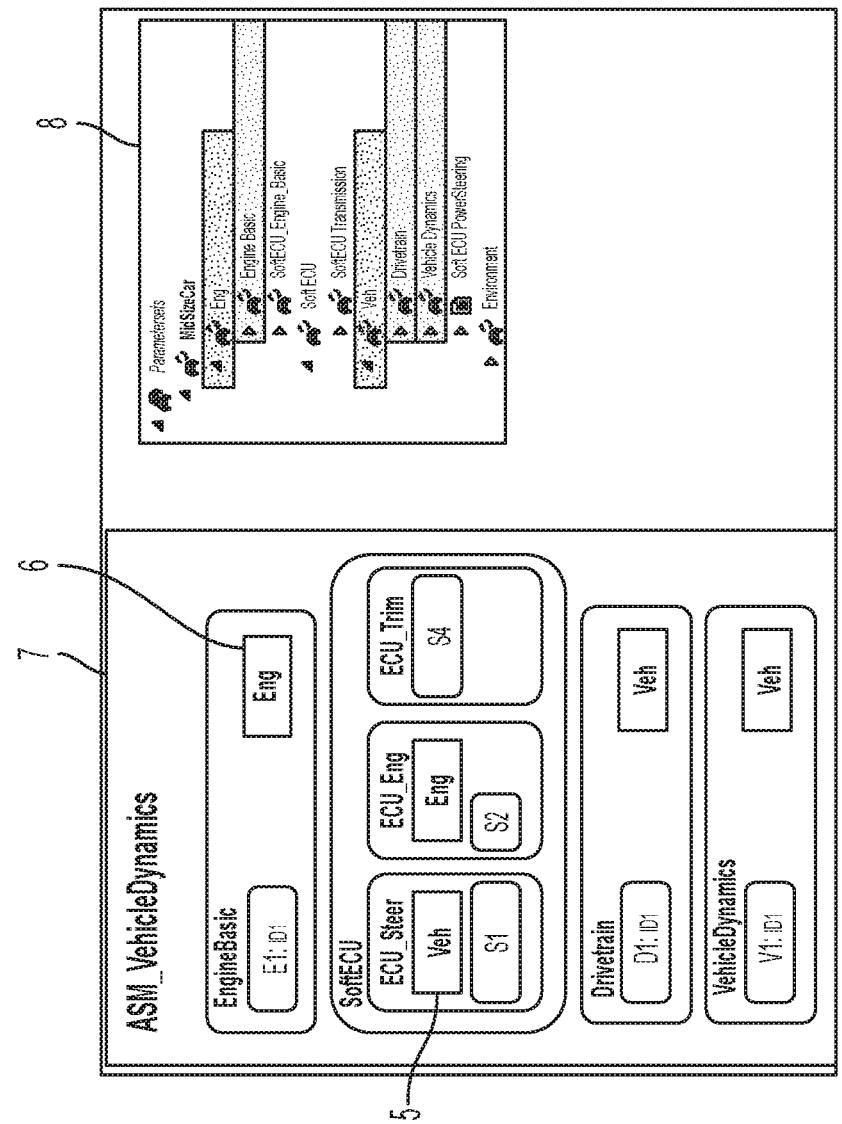

The present invention will become more fully understood from the detailed description given herein below and the accompanying drawings which are given by way of illustration only, and thus, are not limitive of the present invention, and wherein FIG. 1 depicts an exemplary marker block, and FIGS. 2, 3 and 4 depict different exemplary application of marker blocks.

The marker block 1 as shown in FIG. 1 is an elementary block configured to be placed in a graphical Simulation model composed in the Simulink modeling environment by MathWorks. Marker block 1 is called "ModelDesk Group" and may come as part of an expansion block library for supplementing the Simulink block library. Attached to marker block 1 is a block mask 2, block mask 2 comprising an editable field "Group Name." A user may deposit an arbitrary character string in the editable field, wherein, once deposited, the character string will be contained in the marker block 1 as a digital identifier.

FIG. 2 depicts, schematically, a simulation model 7 comprising a first subsystem 3 that contains a simulation submodel of a first vehicle, and a second subsystem 4 that contains a simulation submodel of a second vehicle. Both submodels are identical in that they are composed of the same five simulation model components called SoftECU, Engine, Drivetrain, VehicleDynamics and Environment. Each simulation model component may be extracted from a model component library.

Each simulation model contains a digital component identifier. In this example, a digital component identifier "S1:ID1" is contained in the simulation model component SoftECU in the first subsystem 3. A digital component identifier may have two parts, wherein a first part S1 may be pre-specified and may be used by a parametrization software to recognize simulation model components from the model component library, and a second part ID1 may be user-editable in order to let the parametrization software distinguish different instances of a simulation model component in a simulation model. The second part of the component identifier may be optional.

FIG. 2 also depicts a hierarchical tree 8. Hierarchical tree 8 may be displayed on a screen by a parametrization software. Hierarchical tree 8 lists all the parameters in simulation model 7 in expandable nodes. Parameters in the hierarchical tree 8 may be accessible by a user to alter the value of one or more parameters, and parametrization software may be configured to alter the values of parameters in the simulation model 7 according to the user-initiated alterations in the hierarchical tree 8.

A set of rules may be programmed into the parametrization software, the set of rules defining a default composition of nodes in the hierarchical tree 8. The set of rules may define one node for each simulation model component in the component library and a set of parameters to be listed in said node. The set of rules may, for example, determine that if two similar simulation model components are placed in the simulation model, the parameters from said similar simulation model components should be listed in a common node. Hence, in the depicted simulation model 7, parametrization software would summarize both SoftECU model components in a common node, same for both Engine model components, and so on. The two vehicle submodels would thus be intermingled in the hierarchical tree, making parameter handling via the hierarchical tree confusing.

Therefore, a first marker block 5 with a first digital identifier "Veh1" is added to first subsystem 3, and a second marker block 6 with a second digital identifier "Veh2" is added to second subsystem 4. In the course of analyzing simulation model 7, parametrization software recognizes both the first marker block 5 and the second marker block 6. Parametrization software also recognizes that the first digital identifier and the second digital identifier are not identical. Accordingly, parametrization software creates a hierarchical tree 8, wherein parameters for both vehicle models are isolated in that all simulation model components and corresponding parameters representing the first vehicle are listed in one node "Veh1," and all simulation model components and corresponding parameters representing the second vehicle are listed in another node "Veh2."

As shown in FIG. 2, the digital identifier in a marker block may also define the name of the node created for said marker block.

The simulation model 7 as shown in FIG. 3 is configured to simulate a truck with two identical trailers. Accordingly, simulation model component "Trailer" is present is the simulation model 7 twice. To keep parameters for first trailer and second trailer apart in the hierarchical tree 8, first marker block 5 with first digital identifier "Trailer1" is added to first subsystem 3, first subsystem 3 containing the simulation model component for a first trailer, and second marker block 6 with digital identifier "Trailer2" is added to second subsystem 4, second subsystem 4 containing the simulation model component for a second trailer. Accordingly, in the hierarchical tree 8, all parameters for the first trailer are listed in a node "Trailer1," and all parameters for the second trailer are listed in another node "Trailer2."

Hierarchical tree 8 as shown in FIG. 4 is customized via marker blocks with identical digital identifiers. Three marker blocks containing a first digital identifier "Veh" and two marker blocks containing a second digital identifier "Eng" are added to different subsystems in simulation model 7. In the course of analyzing simulation model 7, parametrization software will recognize the digital identifiers in the marker blocks added to subsystems (or simulation model components, respectively) ECU_Steer, Drivetrain and VehicleDynamics as being identical. Hence, parametrization software will list all these subsystems and their parameters in a common node "Veh" in the hierarchical tree 8. Accordingly, due to identical digital identifiers in the marker blocks added to subsystems EngineBasic and ECU_Eng, parametrization software will list these subsystems and their parameters in a common node "Eng."

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for parametrization of a simulation model, the method comprising:
composing, by a graphical programming environment of a simulation system, the simulation model based on placement of elementary blocks and line connectors between the elementary blocks, wherein the elementary blocks correspond to data operations and the line connectors correspond to data flows, and wherein the elementary blocks are organizable into subsystems, each subsystem comprising one or more elementary blocks and/or one or more further subsystems;

adding, by the graphical programming environment, a first marker block containing a first digital identifier to a first subsystem in the simulation model;

adding, by the graphical programming environment, a second marker block containing a second digital identifier to a second subsystem in the simulation model;

analyzing, by parametrization software of the simulation system, the simulation model, wherein the parametrization software is configured to recognize marker blocks in the simulation model;

listing, by the parametrization software, parameters of the simulation model in a hierarchical tree, displaying the hierarchical tree on a screen, receiving user input to alter at least one parameter of the simulation model in the hierarchical tree, and altering the at least one parameter of the simulation model according to the user input; and determining, by the parametrization software, whether to list the first subsystem and the second subsystem in a common node of the hierarchical tree or in separate nodes of the hierarchical tree based on whether or not the first digital identifier and the second digital identifier are identical, and listing, by the parametrization software, the first subsystem and the second subsystem in a common node of the hierarchical tree or in separate nodes of the hierarchical tree based on a result of the determining.

2. The method according to claim 1, wherein composing the simulation model further comprises extracting a number of simulation model components from a component library and connecting the extracted simulation model components via line connectors to facilitate data exchange between the extracted simulation model components;

wherein the parametrization software is further configured to recognize simulation model components in the simulation model; and wherein the method further comprises:
for each simulation model component in the simulation model, creating one node representing the respective simulation model component; and
listing parameters from each simulation model component in the respective node representing the respective simulation model component.

3. The method according to claim 2, wherein each simulation model component comprises a digital component identifier, and wherein the method further comprises:
for each unique component identifier, creating one node in the hierarchical tree.

4. The method according to claim 1, further comprising:
if the first digital identifier and the second digital identifier are identical, listing the first subsystem and the second subsystem at a hierarchical position in the hierarchical tree that would be parent to the parameters in both the first subsystem and the second subsystem if no marker blocks were added to the simulation model.

5. The method according to claim 1, further comprising:
receiving, by the parametrization software, a selection of a parameter from the hierarchical tree;
altering, by the parametrization software, the value of the selected parameter in the hierarchical tree; and applying, by the parametrization software, the alteration to the simulation model.

6. A simulation system, comprising one or more processors and one or more memories having processor-executable instructions stored thereon for generating simulation models and preparing the simulation models for virtual testing, wherein the processor-executable instructions, when executed by the one or more processors, are configured to provide a software environment, wherein the software environment comprises:

a block library comprising elementary blocks, each block corresponding to a data operation, and the block library further comprising at least one marker block, wherein the at least one marker block is configured to receive a digital identifier deposited in the at least one marker block based on user input;

a graphical programming environment, configured to, based on user input, place a number of elementary blocks from the block library, connect the placed elementary blocks via line connectors for indicating data flows, and organize the elementary blocks into subsystems of a simulation model, wherein each subsystem comprises one or more elementary blocks and/or one or more further subsystems; and parametrization software, configured to analyze the simulation model;

wherein the graphical programming environment is configured to receive user input to place a first marker block containing a first digital identifier in a first subsystem of the simulation model and place a second marker block containing a second digital identifier in a second subsystem of the simulation model;

wherein the parametrization software is configured to recognize marker blocks in the simulation model;

wherein the parametrization software is configured to list parameters of the simulation model in a hierarchical tree, display the hierarchical tree on a screen, receive user input to alter a value of a parameter of the simulation model in the hierarchical tree, and alter the value of the parameter of the simulation model according to the user input;

wherein the parametrization software is configured to determine whether to list the first subsystem and the second subsystem in a common node of the hierarchical tree or in separate nodes of the hierarchical tree based on whether or not the first digital identifier and the second digital identifier are identical, and to list the first subsystem and the second subsystem in a common node of the hierarchical tree or in separate nodes of the hierarchical tree based on a result of the determining.

7. A non-transitory computer-readable medium having processor-executable instructions stored thereon corresponding to parametrization software configured for parametrization of a simulation model, wherein the processor-executable instructions, when executed by a processor, cause the processor to carry out the following:

analyzing the simulation model, wherein analyzing the simulation model comprises recognizing a first marker block in a first subsystem of the simulation model, the first marker block containing a first digital identifier, and recognizing a second marker block in a second subsystem of the simulation model, the second marker block containing a second digital identifier, wherein the simulation model comprises elementary blocks corresponding to data operations and line connectors corresponding to data flows, wherein the elementary blocks are organized into subsystems, and wherein each subsystem comprises one or more elementary blocks and/or one or more further subsystems;

listing the simulation model parameters in a hierarchical tree and displaying the hierarchical tree on a screen;

determining, by the parametrization software, whether to list the first subsystem and the second subsystem in a common node of the hierarchical tree or in separate nodes of the hierarchical tree based on whether or not the first digital identifier and the second digital identifier are identical, and listing, by the parameterization software, the first subsystem and the second subsystem in a common node of the hierarchical tree or in separate nodes of the hierarchical tree based on a result of the determining; and receiving user input to alter at least one parameter of the simulation model in the hierarchical tree and altering the at least one parameter of the simulation model according to the user input.

\* \* \* \* \*